(12) United States Patent
Scuderi et al.

(10) Patent No.: US 7,795,989 B2
(45) Date of Patent: Sep. 14, 2010

(54) CIRCUIT FOR MATCHING THE LOAD IMPEDANCE OF AN ELECTRONIC DEVICE

(75) Inventors: Antonino Scuderi, Misterbianco (IT);
Francesco Carrara, Acireale (IT);
Calogero Davide Presti, Caltanissetta (IT); Giuseppe Palmisano, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 287 days.

(21) Appl. No.: 12/023,538

(22) Filed: Jan. 31, 2008

(65) Prior Publication Data
US 2008/0186105 A1 Aug. 7, 2008

(30) Foreign Application Priority Data
Jan. 31, 2007 (IT) ............... MI2007A0152

(51) Int. Cl.
*H03H 7/38* (2006.01)
(52) U.S. Cl. ....................... 333/17.3; 333/32
(58) Field of Classification Search ............ 33/32, 33/33, 17.3
See application file for complete search history.

(56) References Cited

U.S. PATENT DOCUMENTS

| 379,494 | A | | 3/1888 | Sieberling |
| 5,982,099 | A | * | 11/1999 | Barnes et al. .......... 315/111.21 |
| 2005/0184922 | A1 | * | 8/2005 | Ida et al. ................. 343/861 |
| 2009/0167457 | A1 | * | 7/2009 | Melde et al. .............. 333/32 |

OTHER PUBLICATIONS

Whatley, R., et al., "Reconfigurable RF Impedence Tuner for Match Control in Broadband Wireless Devices," *IEEE Trans. on Antennas and Propagation*, 54(2):470-478, Feb. 2006.

* cited by examiner

*Primary Examiner*—Stephen E Jones
(74) *Attorney, Agent, or Firm*—Lisa K. Jorgenson; Robert Iannacci; Seed IP Law Group PLLC

(57) ABSTRACT

A circuit matches the load impedance of an electronic device. The circuit comprises an impedance network, a control circuit suitable for varying the impedance of said network and a sensor coupled with said network and said load and suitable for detecting the ratio between the incident and reflected standing waves in transferring power from the electronic device to the load; the sensor is suitable for providing two signals substantially proportional to the incident and reflected amplitude of the waves at the control circuit. The impedance network is a network of variable resistances and the control circuit is suitable for varying the value of the resistances to lower said ratio between the incident and reflected standing waves to a value that ensures the transfer of power from the electronic device to the load.

19 Claims, 6 Drawing Sheets

CIRCUIT FOR MATCHING THE LOAD IMPEDANCE OF AN ELECTRONIC DEVICE

BACKGROUND

1. Technical Field

The present invention relates to a circuit for matching the load impedance of an electronic device.

2. Description of the Related Art

Electronic circuits operate on a load that is suitably matched to display their nominal performance. This becomes particularly important for radio-frequency circuits, especially for power amplifiers of radio transmitters.

Using impedance matchers is known in the prior art. A solution near to the needs of high-integration radio-frequency systems is known from U.S. Pat. No. 379,494. Said patent discloses an antenna tuner of automatic type that comprises digital control circuits for selecting reactive tuning elements of an antenna impedance coupling network. The tuner system provides rapid transformations of impedance of a multiple antenna to the load resistance to effectively transfer the power of a power amplifier of a portable radio transmitter to each antenna selected above a wide frequency range, for example, from 2 to 80 Mhz. The impedance coupling network comprises series of inductive and capacitive elements in an L-shaped configuration. The inductive and capacitive elements are matchable in an incremental manner in a binary value and are matched automatically by means of a digital control in response to the sensed antenna impedance to switch values of components in a binary sequence. The tuning of the antenna to couple the antenna to the power amplifier is detected by broadband sensors and is continuously monitored by voltage standing wave ratio (VSWR) that initializes and controls the duration of the tuning cycles according to the detected antenna impedance coupling condition.

A similar implementation to the previous implementation and still relating to a circuit with capacitance and inductance to be interposed between the load and electronic circuit and provided with low-loss switches to reconfigure load impedance following load variation is found in the article "Reconfigurable RF Impedance Tuner for Match Control in Broadband Wireless Devices" by Whatley, R. B.; Zhen Zhou; Melde, K. L., Antennas and Propagation, IEEE Transactions on Volume 54, Issue 2, Part 1, February 2006 pages 470-478.

The above implementations are suitable for monolithic integration (if MOS switches are used) or on a module (if MEMS switches are used). Nevertheless, they are affected by different types of problem such as the dimension of the corrector and the cost thereof, frequency sensibility, the complexity of load impedance detection and of control strategy.

The first problem is due to the need to create numerous modulated high impedance inductances, to working frequencies and to the need to conduct great quantities of current if the application is power amplification.

The second problem depends on the correction strategy, which is based on using reactive elements the impedance of which depends on the frequency; wishing to use the corrector for multiband applications will thus require making distinct blocks, to be used according to the application.

The use of LC networks in systems with very broad bands, on the other hand, is impossible.

The third problem depends on the need to know the module and phase of the load impedance exactly, which thus makes complex circuits for monitoring impedance and sophisticated control strategies necessary.

BRIEF SUMMARY

One embodiment is a device for matching the load impedance that overcomes the aforesaid drawbacks.

One embodiment is a circuit for matching the load impedance of an electronic device, said circuit comprising an impedance network, a control circuit suitable for varying the impedance of said network and a sensor coupled with said network and said load and suitable for detecting the ratio between the incident and reflected standing waves in transferring power from the electronic device to the load, said sensor being suitable for providing two signals substantially proportional to the amplitude of the incident and reflected standing waves on said control circuit, wherein said impedance network is a network of variable resistances and said control circuit is suitable for varying the value of the resistances to lower said ratio between the incident and reflected standing waves to a value that ensures the transfer of power from the electronic device to the load.

BRIEF DESCRIPTION OF THE SEVERAL VIEWS OF THE DRAWINGS

The features and advantages of the present invention will be clear from the following detailed description of a practical embodiment thereof that is illustrated by way of non-limiting example in the attached drawings, in which.

DETAILED DESCRIPTION

The performance of a device in mismatched condition has an impact that depends on the mismatch level. This is expressed by the standing wave ratio or VSWR. In mobile radio applications transmitting a VSWR up to 6:1 is normally required to be guaranteed, whilst in each case the supply current received by the active circuits to the battery should not exceed set limits. Providing high amplification linearity enables one to maintain communication active, specially for high bit-rate communications.

Figure 1:
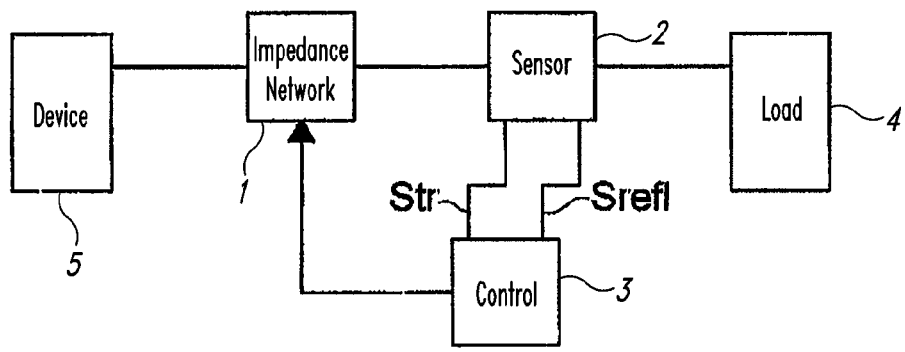
FIG. 1 is a diagram of the device for matching the load impedance according to one embodiment.

In FIG. 1 there is shown a device for matching load impedance according to one embodiment. Said device comprises a mismatching corrector 1, in particular of resistive type, a mismatching sensor 2 and a control circuit 3. The mismatching sensor 2 is of known type, is coupled with the network 1 and with the load 4, is suitable for measuring the ratio between the stationary incident and reflected standing waves in transferring power from the electronic device 5 to the load 4; and is suitable for providing two signals $S_{tr}$, $S_{refl}$ substantially proportional to the incident and reflected amplitude of the waves. Such signals, subject to suitable preconditioning, are used by the control circuit 3 to set the mismatching corrector 1, i.e., to vary the value of the resistances in order to lower said ratio between the incident and reflected standing waves to a value that ensures the transfer of power from the electronic device to the load, as better defined by the following theory.

Figure 5:
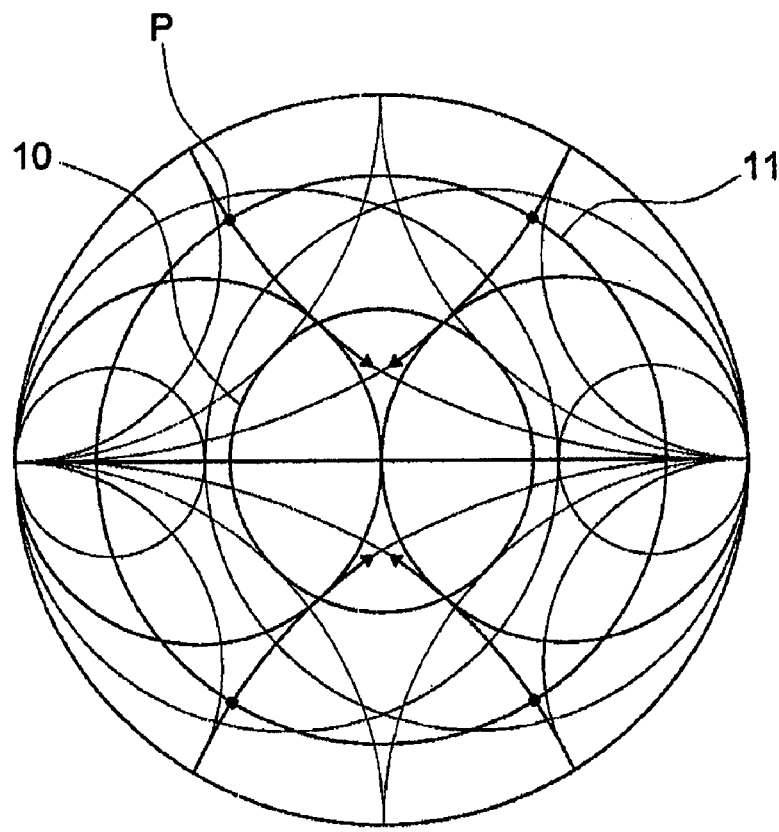
FIGS. 5-8 show transformations with constant VSWR on the Smith chart.
Figure 6:
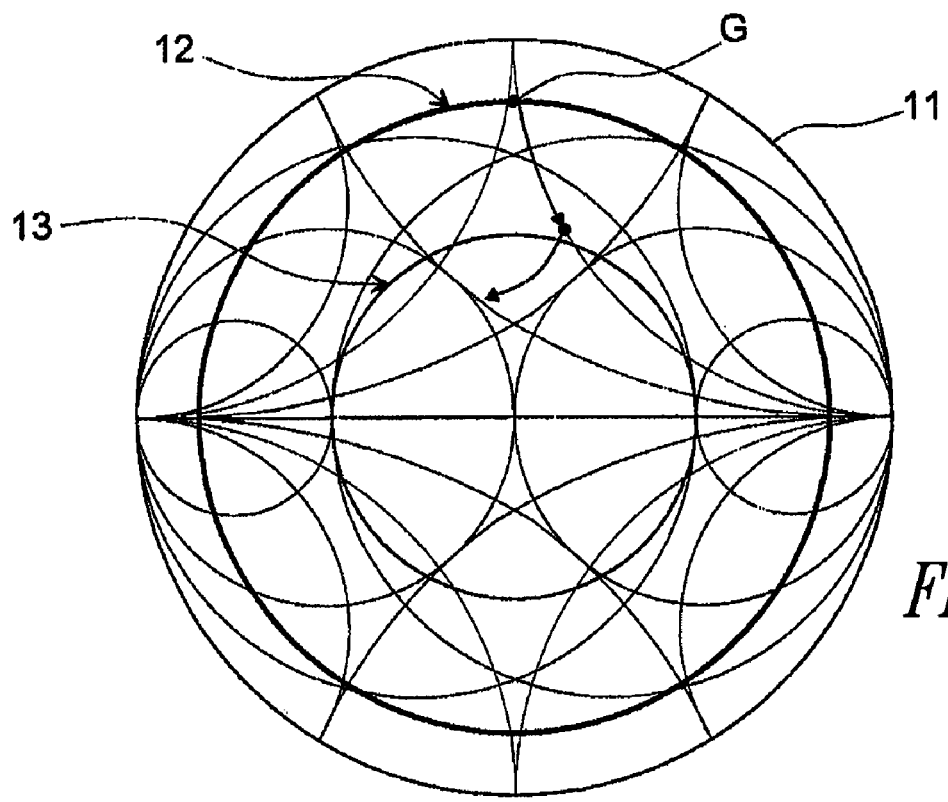

Let the Smith chart, as shown in FIG. 5, be considered, and the place of the points at constant VSWR be identified so as to define a circle that is tangential to the (standardized) constant reactance and susceptance circumferences equal to 1. This circle, which we shall call "limit circle", corresponds to a VSWR equal to approximately 2.4. As can be easily inferred, there always exists a resistor of suitable value to be connected serially or parallel that can transform any point P outside the limit circle (indicated by the circumference 10) at a point belonging thereto (for example the points on the circumference 11, corresponding to a VSWR equal to 10:1). The connection of the resistor will be serial or parallel depending on the impedance phase to be transformed. In order to have a corrector control system that is independent of the load phase it is possible to use transformation pairs. In FIG. 6 there is identified the place of the points with VSWR equal to 10:1 (curve 12), which represents impedance that is very distant from optimum impedance. In the same manner, the place of the points with VSWR equal to 3:1 (curve 13) is identified, which relates to impedance near optimum impedance. Any point G outside the area enclosed by the circle 13 can be brought inside the circle by moving on the constant reactance/susceptance circles, with at least two consecutive movements: the first on a constant reactance circle (serial resistance) and the second on a constant susceptance circle (parallel resistance). Such transformations are independent of the work frequency. The order of the two transformations can be changed, without altering the efficacy of the method; in particular a parallel resistance can first be added to the load and then a serial resistance can be added.

Figure 7:
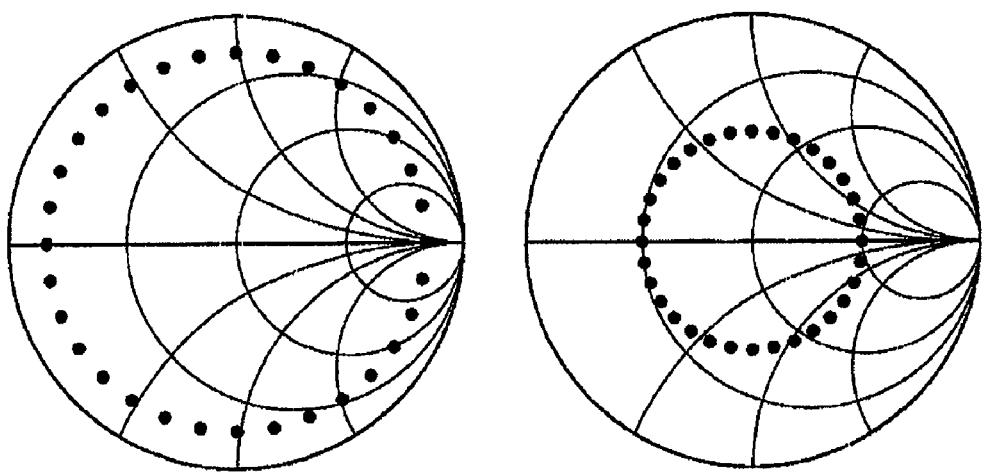

An appropriate choice of the serial resistance and parallel values enables a jump to be achieved from a circle far from optimum impedance to one nearer optimum impedance independently of the original impedance phase, as shown in FIG. 7.

In order to demonstrate what has been affirmed, let it be supposed that it is wished to transform the circle with VSWR=V into a circle with VSWR=Vr, with V>Vr, considering V to be the value of the VSWR ratio detected by the sensor 2 and Vr the value that ensures the transfer of power from the electronic device to the load. For simplicity, reference is made to a case in which a serial resistance is added first, i.e., a resistance coupled between the electronic device 5 and the load 4, and then a parallel resistance to the electronic device 5 is added, i.e., a resistance coupled between the electronic device and ground GND (similar expressions are obtained exchanging the order of the resistors). It can be easily understood that the serial and parallel (standardized) resistances $r_s$ and $r_p$ satisfy the following system:

$$\begin{cases} \frac{1}{r_s+V} + \frac{1}{r_p} = \frac{1}{Vr} \\ \frac{1}{r_s+1/V} + \frac{1}{r_p} = Vr, \end{cases}$$

which always has a pair of positive solutions. In particular, it is found that $$\begin{cases} r_s = \frac{\sqrt{V^2-1} \cdot \left( \sqrt{\frac{(Vr^2-1) \cdot (V^2(Vr^2-1)+}{4V*Vr-Vr^2+1)}} + (Vr^2+1) \cdot \sqrt{V^2-1} \right)}{2(V^2*Vr+V(1-Vr^2)-Vr)} \\ r_p = \frac{\sqrt{V^2-1} \cdot \sqrt{\frac{(Vr^2-1) \cdot (V^2(Vr^2-1)+}{4V*Vr-Vr^2+1)}} + (1-Vr^2) \cdot (V^2+1)}{2V(Vr^2-1)}. \end{cases}$$

For example, in FIG. 7, it should be noted how the circle with a 10:1 VSWR is transformed into a circle with a VSWR equal to 3:1, because Rs=13Ω and Rp=212Ω have been chosen.

Figure 8:
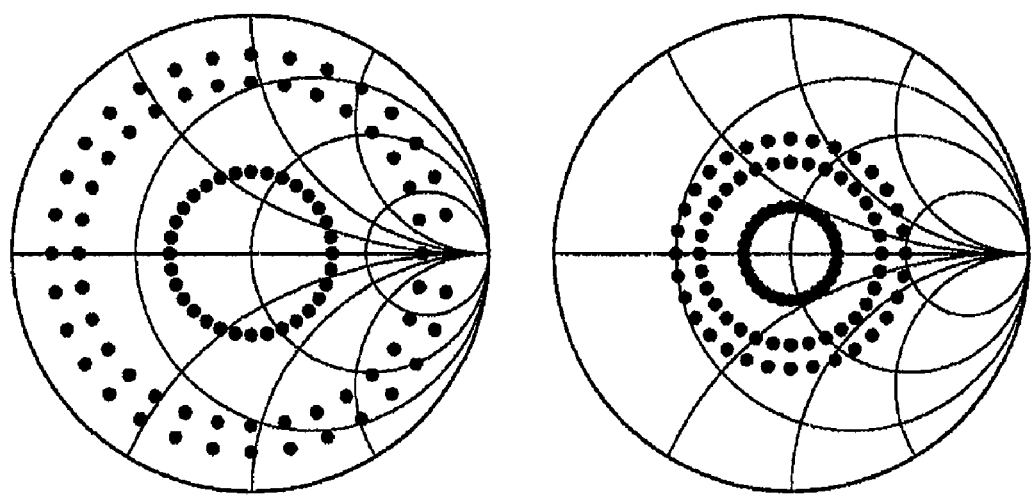

With the same resistors, if the original VSWR had been smaller the transformation would have produced a final circle that was still nearer to optimum impedance, as is shown in FIG. 8, where the loads with VSWR=2, 6, 10 are all transformed into points with VSWR<3.

Figure 2:
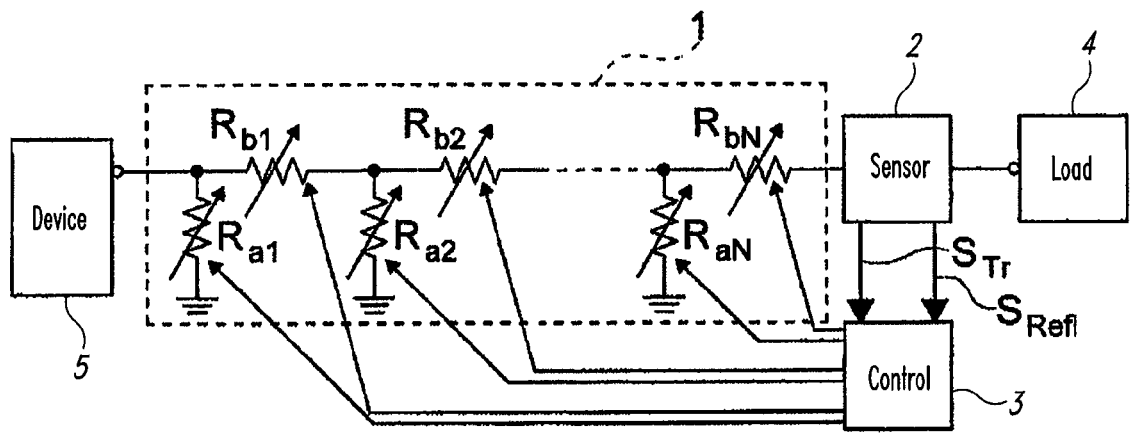
FIG. 2 is a diagram of the device for matching the load impedance according to one embodiment.
Figure 3:
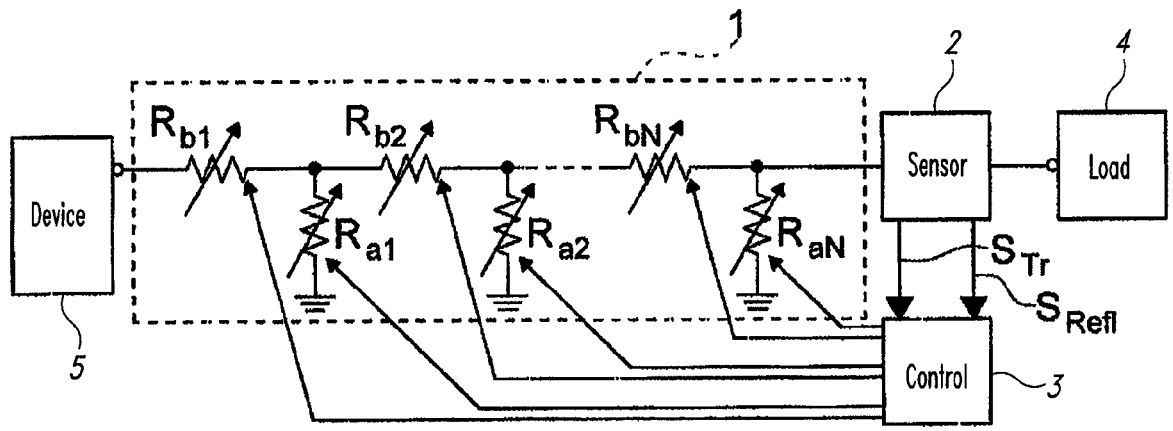
FIG. 3 is a diagram of the device for matching the load impedance according to one embodiment.

The corrector proper includes the series of N heat-sink blocks implemented with a serial heat sink and a parallel heat sink, according to the diagrams in FIGS. 2 and 3. Resistances $R_{ai}$ and $R_{bi}$ with i=1 ... N, are heat-sink components that are analogically or digitally variable. The value of the resistors $R_{ai}$ and $R_{bi}$ can also be zero (short circuit) or infinite (open circuit), depending on requirements. The resistances $R_{ai}$ achieve the transformation on constant susceptance circles whilst the resistances $R_{bi}$ achieve the transformation on constant reactance circles. In general, the number of blocks depends on the required performance, a single block sometimes being sufficient.

The variability of the resistances enables correction (and consequent losses) in the event of sufficiently good matching to be avoided, a moderate correction with low loss to be actuated in the case of moderate mismatching and a greater correction to be made for still more pronounced mismatching.

Figure 4:
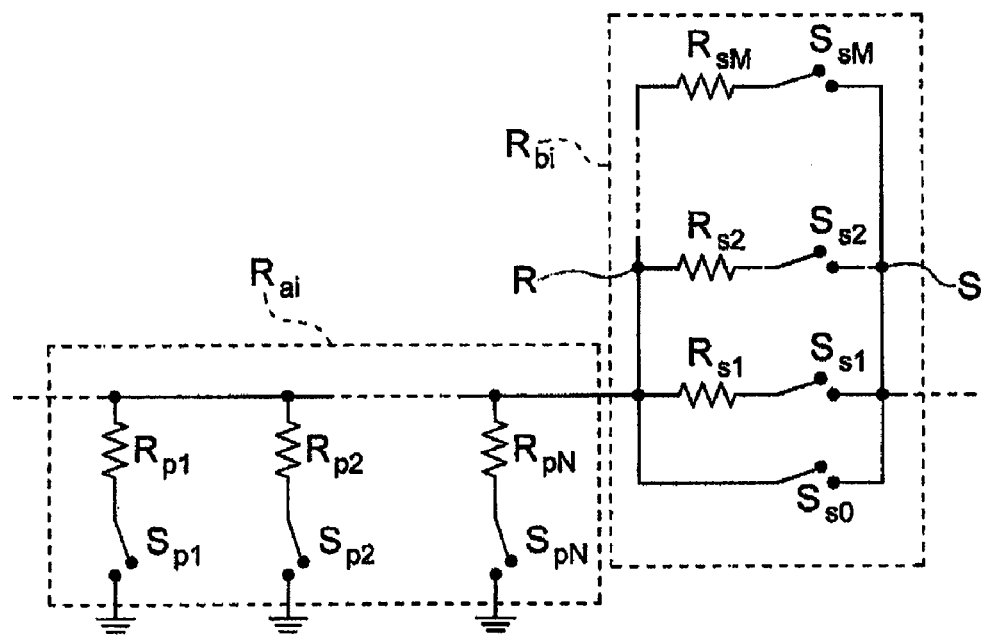
FIG. 4 shows a diagram embodying the resistances in FIGS. 2 and 3.

In particular, each pair of resistors $R_{ai}$ and $R_{bi}$ in FIGS. 2 and 3 can be made according to the diagram in FIG. 4, where digital control is achieved by means of switches. More in detail, the resistance $R_{ai}$ consists of resistances $R_{P1}$ ... $R_{PN}$ having a terminal that is in common and is coupled with the switches $S_{P1}$ ... $S_{PN}$, which are in turn grounded GND and the resistance $R_{bi}$ comprises the resistances $R_{S1}$ ... $R_{SM}$ having a common terminal R and coupled with the respective switches $S_{S1}$ ... $S_{SM}$ having a terminal in common S; the terminals R and S are coupled by a transistor $S_{S0}$. Said switches are piloted by the control circuit 3.

It is emphasized that the proposed solution can also be used in combination with a tuner that is not a heat sink. In fact, the proposed solution can perform part of the matching, making a further tuner that is not a heat sink simpler and more compact.

With respect to tuners that are not heat sinks, the losses introduced by the proposed solution are greater. On the other hand, numerous advantages are disclosed below.

The circuit is not sensitive to work frequency, inasmuch as the impedance of the elements used does not depend on the frequency (as occurs on the other hand with reactive elements); this enables the same corrector to be used in multiband or very wide-band systems.

The circuit is easily integratable in monolithic form, in an economical manner and without requiring much space or particular technological processes as it does not require inductors.

Further, the circuit does not require the load impedance phase to be measured inasmuch as the same pair of resistances enables any load characterized by a certain VSWR to be transformed correctly.

The resistances are adjusted in function of the VSWR of the load, which can be monitored by reading only the amplitude of the outlets of a directional coupler.

An implementation of the device according to one embodiment is obtained by improving the performance of a linear power amplifier. The analysis is presented of the effects of the connection of the tuner between an amplifier matched at 50 ohm and the antenna, when the latter is mismatched.

The amplifier is able to dispense 24 dBm of power when the antenna has impedance equal to 50 ohm.

The reported implementation exploits digital functionality to avoid losses in matched conditions and uses two pairs of resistors: the first is activated for VSWR between 3 and 6; the second for VSWR above 6.

Figure 9:
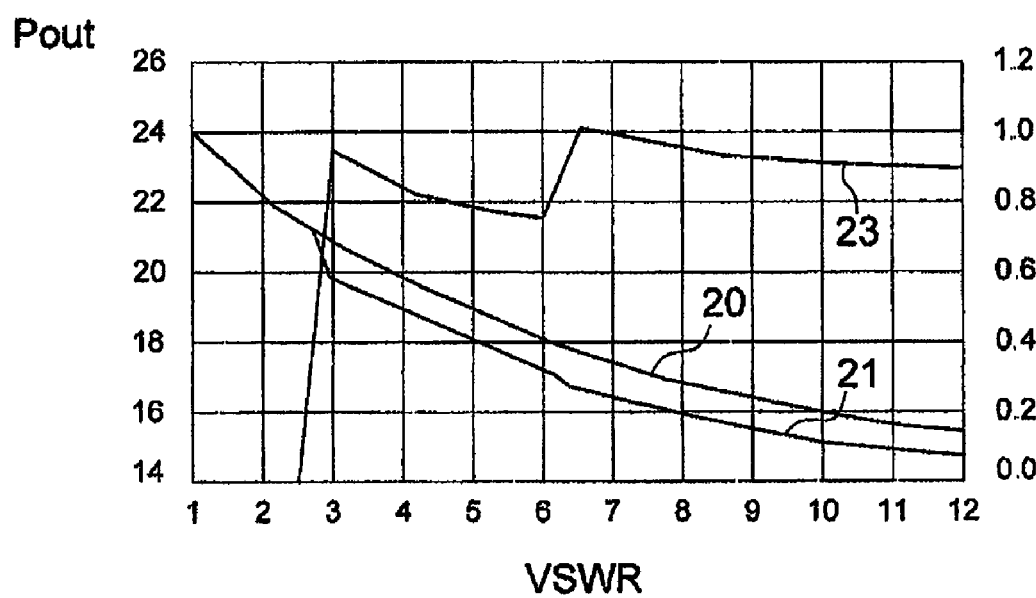
FIGS. 9-11 show diagrams of the output power Pout, of the absorbed current I and of the minimum power P in function of the VSWR ratio.

In FIG. 9, the curve 20 represents minimum power Pout (dbm) (with variation of the phase) dispensed to the antenna in function of the mismatching. The curve 21 represents the same quantity when the tuner is interposed. The heat-sink feature of the tuner implies an additional loss of power that is containable within 1 dB (curve 23).

Figure 10:
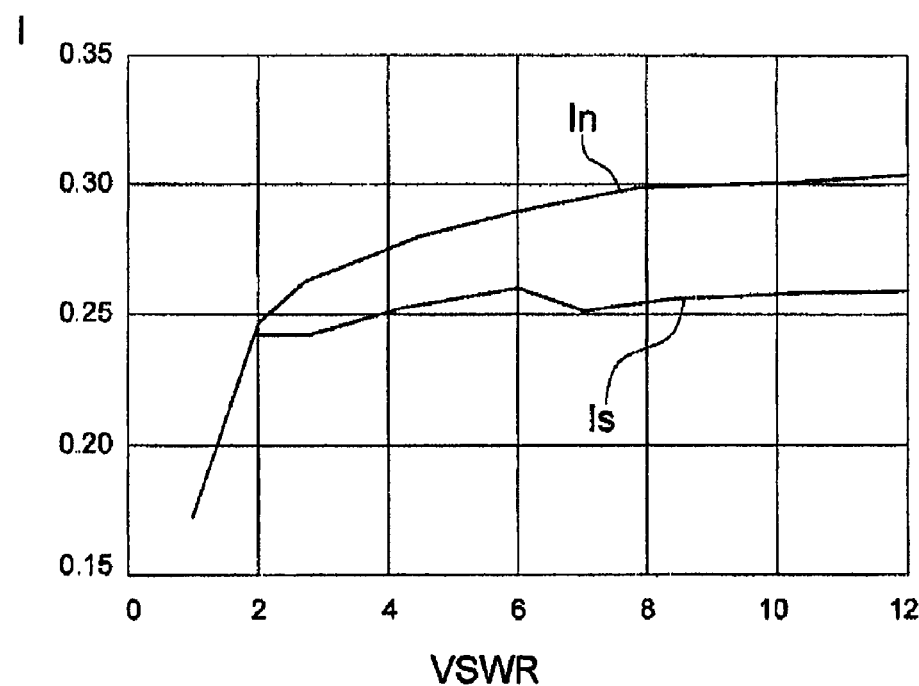

One of the advantages for performance, due to the use of the proposed solution is, as shown in FIG. 10, the smaller amount of Is current absorbed by the amplifier: it should be known that when the tuner is present the current is less than when it is not inserted, i.e., than the current In.

Figure 11:
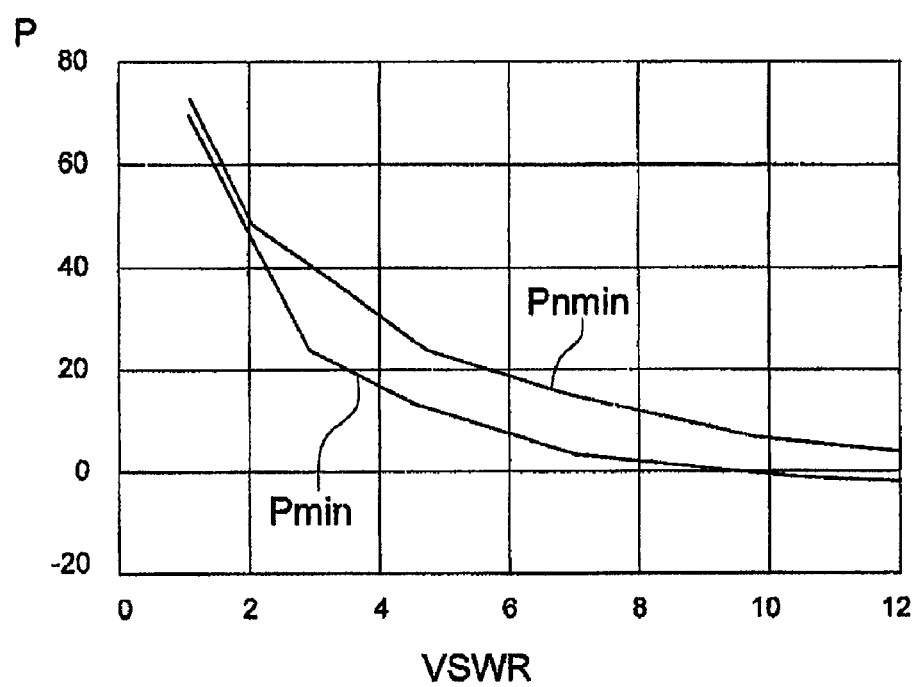

The lower power Pmin, combined with less absorbed current Is, leads in any case to efficiency, in mismatched conditions, that is less than the amplifier without tuner (FIG. 11 in which the amplifier without tuner has power Pnmin), but this loss of efficiency is modest and is usually not significant in the applications.

Figure 12:
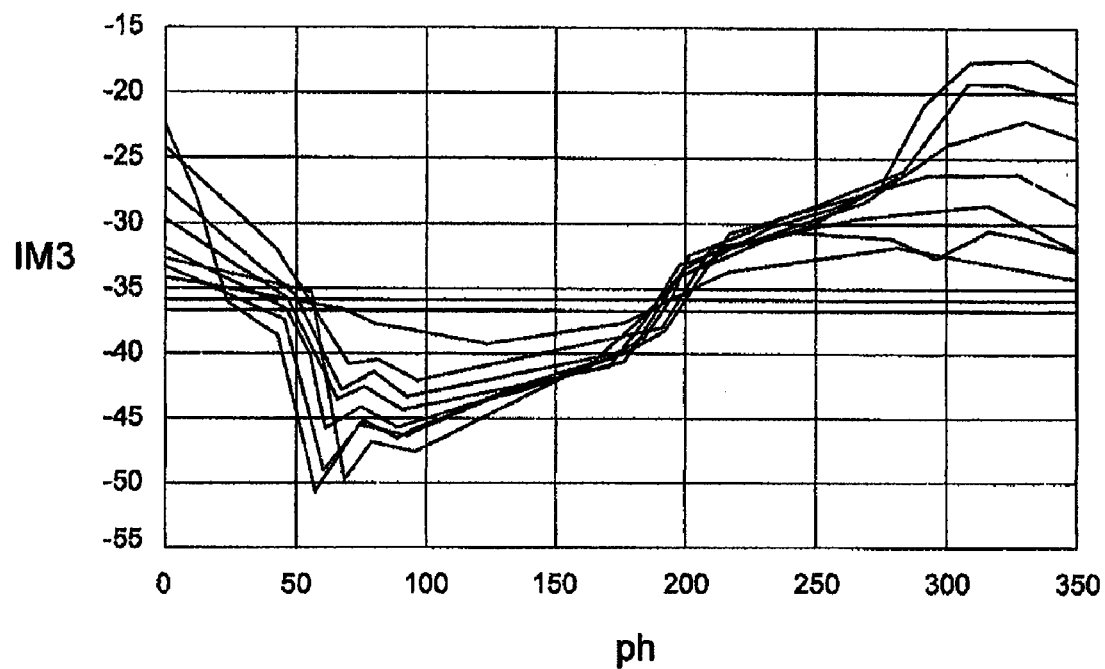
FIGS. 12 and 13 show the distortion diagrams IM3 in function of the frequency ph.

On the other hand, it is very important to ensure the invariability of the linearity with respect to the mismatching. In FIG. 12 there is shown the mismatching effect on the distortion of third order intermodulation (IM3) when the tuner is not present; distortion IM3 degrades by as much as 20 dB.

Figure 13:
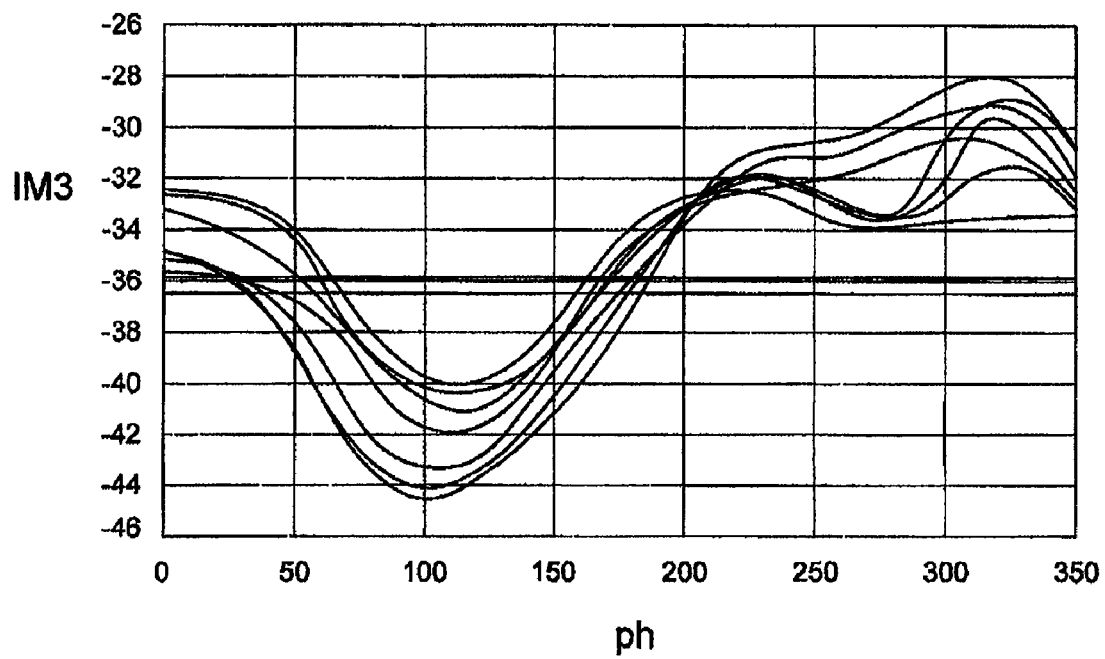

In FIG. 13, on the other hand, there is shown the result with the tuner of the device for matching impedance according to the invention inserted and it should be noted how the distortion IM3 degrades by only 8 dB. This performance is highly requested in all radio transmission systems and specially for linear applications with a high bit rate.

The devices described above are integratable, small, and cheap, and their power consumption is negligible. In addition, the system can be made as insensible as possible to frequency, which is very beneficial for users in multiband and broadband systems.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit for matching an impedance of a load of an electronic device, said circuit comprising:
   a sensor structured to detect a first value of a ratio between incident and reflected standing waves in transferring power from the electronic device to the load, said sensor being structure to provide first and second signals substantially proportional to amplitudes of the incident and reflected standing waves;
   an impedance network of variable resistances; and
   a control circuit coupled to receive the first and second signals from the sensor and structured to vary values of the resistances to lower said ratio between the incident and reflected standing waves to a second value that ensures the transfer of power from the electronic device to the load.

2. A circuit according to claim 1, wherein said network of variable resistances comprises at least a resistance arranged serially between the electronic device and the load and at least a resistance arranged parallel to the electronic device.

3. A circuit according to claim 1, wherein said electronic device is a radio frequency amplifier and said load is an antenna.

4. A circuit according to claim 1, wherein said network comprises a succession of variable resistances, some of them arranged serially between the electronic device and the load and others arranged parallel to the electronic device.

5. A circuit according to claim 1, wherein each resistance is made in digital form with dedicated switches.

6. A circuit according to claim 1, wherein the network comprises a resistance arranged serially between the electronic device and the load, a resistance arranged parallel to the electronic device, and a switch arranged parallel to the serial resistance and activatable when mismatching is not present.

7. A circuit according to claim 1, wherein the first value of said ratio between the incident and reflected standing waves detected by said sensor belongs to a first circumference on a Smith chart, said first circumference being a place of points with said detected first value and being tangential to standardized and constant reactance and susceptance circumferences, and the second value of said ratio between the incident and reflected standing waves belongs to a second circumference on the Smith chart, said second circumference being a place of points with said second value and being tangential to the standardized and constant reactance and susceptance circumferences, said control circuit being suitable for varying the values of the resistances for transforming a point belonging to said first circumference in a point belonging to said second circumference moving on the standardized and constant reactance and susceptance circumferences on the Smith chart.

8. A circuit according to claim 7, wherein said network comprises at least a resistance arranged serially between the electronic device and the load and at least a resistance arranged parallel to the electronic device, said control circuit is suitable for defining the values of said resistances in accordance with the following system:

$$\begin{cases} \dfrac{1}{r_s+V} + \dfrac{1}{r_p} = \dfrac{1}{Vr} \\ \dfrac{1}{r_s+1/V} + \dfrac{1}{r_p} = Vr, \end{cases}$$

having as a solution $$\begin{cases} r_s = \dfrac{\sqrt{V^2-1} \cdot \left( \sqrt{\dfrac{(Vr^2-1)\cdot(V^2(Vr^2-1)+}{4V*Vr-Vr^2+1)}} + (Vr^2+1)\cdot\sqrt{V^2-1} \right)}{2(V^2*Vr+V(1-Vr^2)-Vr)} \\ r_p = \dfrac{\sqrt{V^2-1} \cdot \sqrt{\dfrac{(Vr^2-1)\cdot(V^2(Vr^2-1)+}{4V*Vr-Vr^2+1)}} + (1-Vr^2)\cdot(V^2+1)}{2V(Vr^2-1)}. \end{cases}$$

where $r_s$ is the series resistance, $r_p$ is the parallel resistance, V is the first value of the ratio between the incident and reflected standing waves detected by the sensor and Vr is the second value of the ratio between the incident and reflected standing waves.

9. A system, comprising:
an electronic device;
a load; and
a circuit coupled to the electronic device and the load and structured to match an impedance of the load, said circuit including:
  a sensor structured to detect a first value of a ratio between incident and reflected standing waves in transferring power from the electronic device to the load, said sensor being structure to provide first and second signals substantially proportional to amplitudes of the incident and reflected standing waves;
  an impedance network of variable resistances; and
  a control circuit coupled to receive the first and second signals from the sensor and structured to vary values of the resistances to lower said ratio between the incident and reflected standing waves to a second value that ensures the transfer of power from the electronic device to the load.

10. A system according to claim 9, wherein said network of variable resistances comprises at least a resistance arranged serially between the electronic device and the load and at least a resistance arranged parallel to the electronic device.

11. A system according to claim 9, wherein said electronic device is a radio frequency amplifier and said load is an antenna.

12. A system according to claim 9, wherein said network comprises a succession of variable resistances, some of them arranged serially between the electronic device and the load and others arranged parallel to the electronic device.

13. A system according to claim 9, wherein each resistance is made in digital form with dedicated switches.

14. A system according to claim 9, wherein the network comprises a resistance arranged serially between the electronic device and the load, a resistance arranged parallel to the electronic device, and a switch arranged parallel to the serial resistance and activatable when mismatching is not present.

15. A system according to claim 9, wherein the first value of said ratio between the incident and reflected standing waves detected by said sensor belongs to a first circumference on a Smith chart, said first circumference being a place of points with said detected first value and being tangential to standardized and constant reactance and susceptance circumferences, and the second value of said ratio between the incident and reflected standing waves belongs to a second circumference on the Smith chart, said second circumference being a place of points with said second value and being tangential to the standardized and constant reactance and susceptance circumferences, said control circuit being suitable for varying the values of the resistances for transforming a point belonging to said first circumference in a point belonging to said second circumference moving on the standardized and constant reactance and susceptance circumferences on the Smith chart.

16. A system according to claim 15, wherein said network comprises at least a resistance arranged serially between the electronic device and the load and at least a resistance arranged parallel to the electronic device, said control circuit is suitable for defining the values of said resistances in accordance with the following system:

$$\begin{cases} \dfrac{1}{r_s+V} + \dfrac{1}{r_p} = \dfrac{1}{Vr} \\ \dfrac{1}{r_s+1/V} + \dfrac{1}{r_p} = Vr, \end{cases}$$

having as a solution $$\begin{cases} r_s = \dfrac{\sqrt{V^2-1} \cdot \left( \sqrt{\dfrac{(Vr^2-1)\cdot(V^2(Vr^2-1)+}{4V*Vr-Vr^2+1)}} + (Vr^2+1)\cdot\sqrt{V^2-1} \right)}{2(V^2*Vr+V(1-Vr^2)-Vr)} \\ r_p = \dfrac{\sqrt{V^2-1} \cdot \sqrt{\dfrac{(Vr^2-1)\cdot(V^2(Vr^2-1)+}{4V*Vr-Vr^2+1)}} + (1-Vr^2)\cdot(V^2+1)}{2V(Vr^2-1)}. \end{cases}$$

where $r_s$ is the series resistance, $r_p$ is the parallel resistance, V is the first value of the ratio between the incident and reflected standing waves detected by the sensor and Vr is the second value of the ratio between the incident and reflected standing waves.

17. A method, comprising:
matching an impedance of a load of an electronic device, the matching including:
  detecting a first value of a ratio between incident and reflected standing waves in transferring power from the electronic device to the load, the detecting including providing first and second signals substantially proportional to amplitudes of the incident and reflected standing waves; and
  lowering said ratio between the incident and reflected standing waves to a second value that ensures the transfer of power from the electronic device to the load by varying values of resistances of an impedance network coupled between the electronic device and the load based on the first and second signals.

18. A method according to claim 17, wherein said network of variable resistances comprises at least a resistance arranged serially between the electronic device and the load and at least a resistance arranged parallel to the electronic device.

19. A method according to claim 17, wherein said network comprises a series resistance and a parallel resistance, wherein varying the values of the resistances includes defining the values of said resistances in accordance with the following system:

$$\begin{cases} \dfrac{1}{r_s+V} + \dfrac{1}{r_p} = \dfrac{1}{Vr} \\ \dfrac{1}{r_s+1/V} + \dfrac{1}{r_p} = Vr, \end{cases}$$

having as a solution $$\begin{cases} r_s = \dfrac{\sqrt{V r^2-1}\cdot\left(\sqrt{(Vr^2-1)\cdot(V^2(Vr^2-1)+4V*Vr-Vr^2+1)} + (Vr^2+1)\cdot\sqrt{V r^2-1}\right)}{2(V^2*Vr+V(1-Vr^2)-Vr)} \\ r_p = \dfrac{\sqrt{V r^2-1}\cdot\sqrt{(Vr^2-1)\cdot(V^2(Vr^2-1)+4V*Vr-Vr^2+1)} + (1-Vr^2)\cdot(V^2+1)}{2V(Vr^2-1)}. \end{cases}$$

where $r_s$ is the series resistance, $r_p$ is the parallel resistance, V is the first value of the ratio, and Vr is the second value of the ratio between the incident and reflected standing waves.

* * * * *